(12) United States Patent
Yu et al.

(10) Patent No.: US 7,279,735 B1
(45) Date of Patent: Oct. 9, 2007

(54) FLASH MEMORY DEVICE

(75) Inventors: Bin Yu, Cupertino, CA (US); Haihong Wang, Milpitas, CA (US)

(73) Assignee: Spansion LLC, Sunnyvale, CA (US)

( * ) Notice: Subject to any disclaimer, the term of this patent is extended or adjusted under 35 U.S.C. 154(b) by 442 days.

(21) Appl. No.: 10/838,215

(22) Filed: May 5, 2004

(51) Int. Cl.
*H01L 29/788* (2006.01)
(52) U.S. Cl. ........................... 257/315; 257/316
(58) Field of Classification Search ......... 257/314–326
See application file for complete search history.

(56) References Cited

U.S. PATENT DOCUMENTS

| | | | |
|---|---|---|---|
| 6,251,729 B1 | 6/2001 | Montree et al. | 438/257 |
| 6,657,252 B2 | 12/2003 | Fried et al. | 257/316 |
| 6,963,104 B2 | 11/2005 | Wu et al. | 257/315 |
| 2003/0178670 A1* | 9/2003 | Fried et al. | 257/315 |
| 2005/0242388 A1 | 11/2005 | Willer et al. | 257/314 |

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.
Yang-Kyu Choi et al., "Sub-20nm CMOS FinFET Technologies," 2001 IEEE, IEDM, pp. 421-424.
Xuejue Huang et al., "Sub-50 nm P-Channel FinFET," IEEE Transactions on Electron Devices, vol. 58, No. 5, May 2001, pp. 880-886.
Xuejue Huang et al., "Sub 50-nm FinFET: PMOS," IEEE, IEDM, pp. 67-70.
Yang-Kyu Choi et al., "Nanoscale CMOS Spacer FinFET for the Terabit Era," IEEE Electron Device Letters, vol. 23, No. 1, Jan. 2002, pp. 25-27.
Co-pending U.S. Appl. No. 10/929,538 by Yu et al., filed Aug. 31, 2004, entitled "Non-Volatile Memory Device", 25 pages.

* cited by examiner

*Primary Examiner*—Hung Vu
(74) *Attorney, Agent, or Firm*—Harrity Snyder LLP

(57) ABSTRACT

A non-volatile memory device includes a substrate, an insulating layer, a fin structure, a floating gate, an inter-gate dielectric and a control gate. The insulating layer is formed on the substrate and the fin structure is formed on the insulating layer. The fin structure may include a strained layer formed on a non-strained layer.

18 Claims, 11 Drawing Sheets

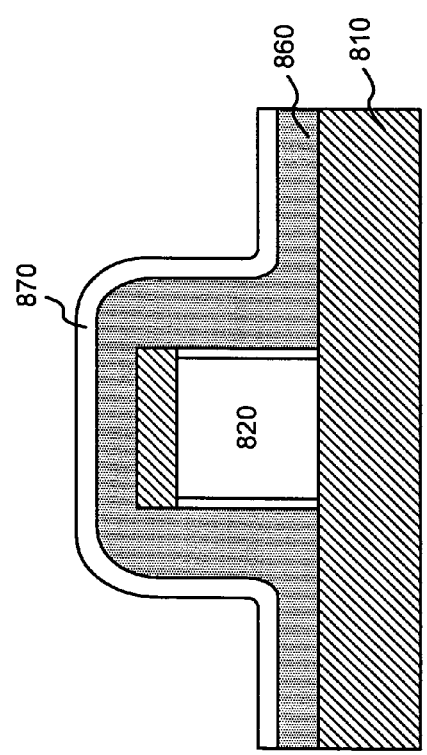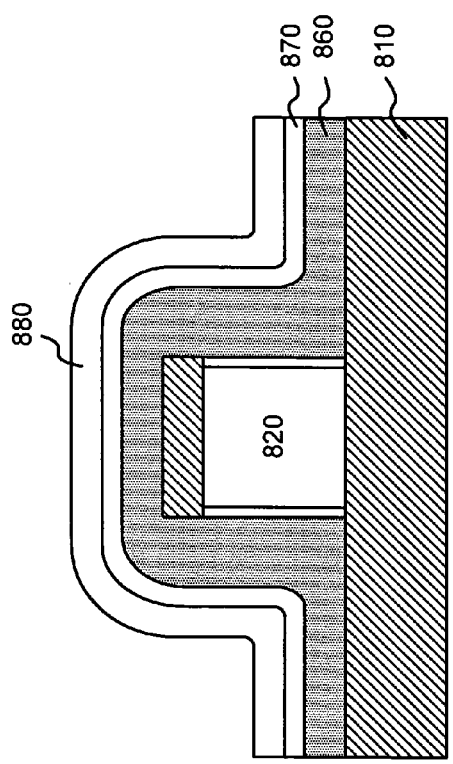

FLASH MEMORY DEVICE

TECHNICAL FIELD

The present invention relates to memory devices and methods of manufacturing memory devices. The present invention has particular applicability to non-volatile memory devices.

BACKGROUND ART

The escalating demands for high density and performance associated with non-volatile memory devices require small design features, high reliability and increased manufacturing throughput. The reduction of design features, however, challenges the limitations of conventional methodology. For example, the reduction of design features makes it difficult for the memory device to meet its expected data retention requirement, e.g., a ten year data retention requirement.

DISCLOSURE OF THE INVENTION

Implementations consistent with the present invention provide a non-volatile memory device that includes a floating gate formed over a fin structure. The fin structure may comprise a strained layer over a relaxed layer. A control gate may be formed over the floating gate, with the control gate being separated from the floating gate by a dielectric layer.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a memory device that includes a substrate, an insulating layer, a fin structure, a semiconducting layer, a dielectric layer and a control gate. The insulating layer is formed on the substrate and the fin structure is formed on the insulating layer. The fin structure includes a first portion comprising a first material and a second portion comprising a second material disposed on the first portion, where the second material is different than the first material. The semiconducting layer is formed over the fin structure and acts as a floating gate for the memory device. The dielectric layer is formed on the semiconducting layer and acts as an inter-gate dielectric for the memory device. The control gate is formed on the gate dielectric layer.

According to another aspect of the invention, a method of manufacturing a non-volatile memory device is provided. The method includes forming a fin structure on an insulating layer, where the fin structure includes a first portion and a second portion formed on the first portion. The second portion comprises a strained conductive material. The method also includes forming a floating gate over the fin structure, forming an inter-gate dielectric over the floating gate and depositing a gate material over the inter-gate dielectric. The method further includes patterning and etching the gate material to form at least one control gate.

According to another aspect of the invention, a memory device that includes a substrate, an insulating layer, a fin structure, a floating gate, a dielectric layer and a control gate is provided. The insulating layer is formed on the substrate and the fin structure is formed on the insulating layer. The fin structure includes a strained material. The floating gate is formed above the fin structure and the dielectric layer is formed on the floating gate. The dielectric layer acts as an inter-gate dielectric for the memory device. The control gate is formed on the dielectric layer.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 8A-8D are cross-sections illustrating the formation of a memory device with a fully silicided floating gate in accordance with another embodiment of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide non-volatile memory devices, such as flash memory devices, and methods of manufacturing such devices. The flash memory devices may include a fin structure that includes a strained layer over a relaxed layer. A floating gate and control gate may be formed over the fin structure, separated by an inter-gate dielectric.

Figure 1:
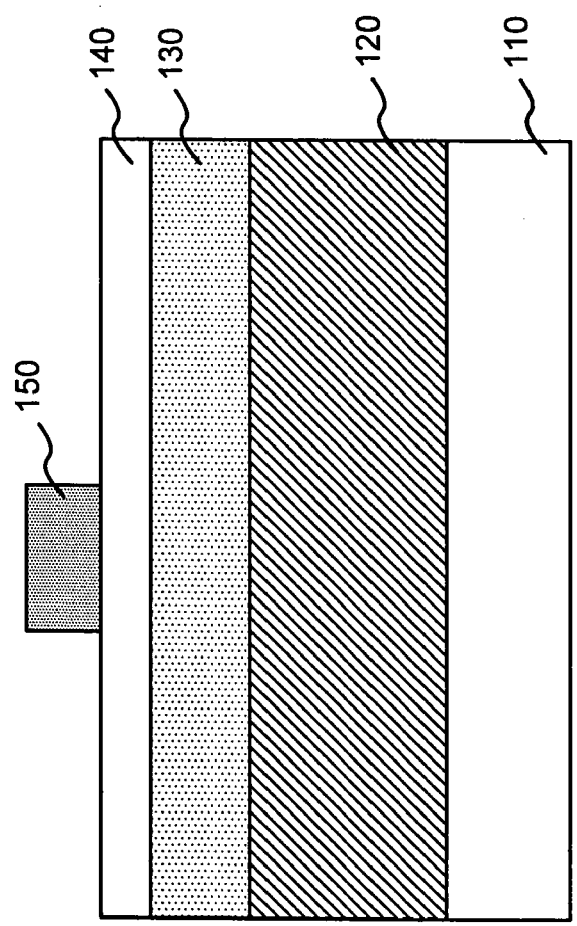
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Referring to FIG. 1, semiconductor device 100 may include a silicon-germanium on insulator (SGOI) structure that includes a silicon-germanium substrate 110, a buried oxide layer 120, a silicon-germanium layer 130 on the buried oxide layer 120 and a silicon layer 140 formed on the silicon-germanium layer 130.

Buried oxide layer 120, silicon-germanium layer 130 and silicon layer 140 may be formed on substrate 110 in a conventional manner. In an exemplary implementation, buried oxide layer 120 may include a silicon oxide, such as $SiO_2$, and may have a thickness ranging from about 1500 Å to about 3000 Å. Silicon-germanium layer 130 may have a thickness ranging from, for example, about 300 Å to about 500 Å. Silicon layer 140 may include monocrystalline or polycrystalline silicon having a thickness ranging from, for example, about 150 Å to about 250 Å. Silicon-germanium layer 130 and silicon layer 140 may be used to form a fin structure, as described in more detail below.

Silicon layer 140 may also be a strained layer due to lattice mismatch and silicon-germanium layer 130 may be a relaxed (i.e., non-strained) layer. A dielectric layer (not shown), such as a silicon nitride layer or a silicon oxide layer, may be formed over silicon layer 140 to act as a protective cap during subsequent etching processes.

In alternative implementations consistent with the present invention, substrate 110 and layer 130 may comprise other semiconducting materials, such as silicon or germanium, as opposed to silicon-germanium. Buried oxide layer 120 may also include other dielectric materials.

Referring back to FIG. 1, a photoresist material may be deposited and patterned to form a photoresist mask 150 for subsequent processing. The photoresist may be deposited and patterned in any conventional manner.

Figure 2A:
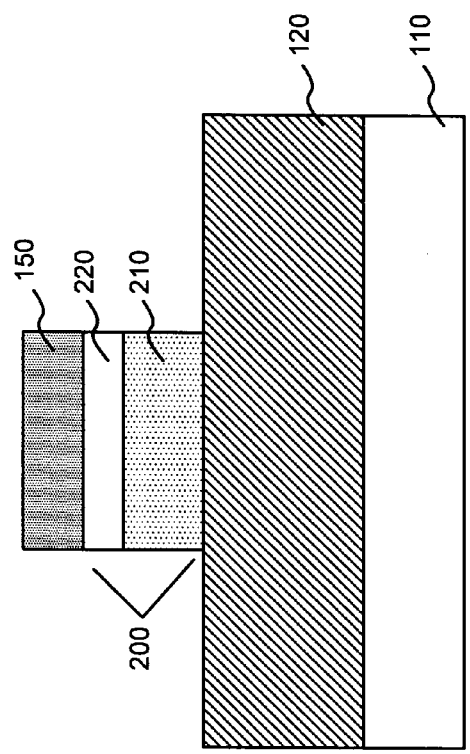
FIG. 2A is a cross-section illustrating the formation of a fin in accordance with an exemplary embodiment of the present invention.

Semiconductor device 100 may then be etched. In an exemplary implementation, silicon layer 140 and silicon-germanium layer 130 may be etched in a conventional manner, with the etching terminating on buried oxide layer 120, as illustrated in FIG. 2A. Referring to FIG. 2A, silicon layer 140 and silicon-germanium layer 130 have been etched to form a fin 200 comprising a relaxed silicon-germanium portion/layer 210 with a strained silicon portion/layer 22b formed thereon. In an exemplary implementation, the width of fin 200 ranges from about 100 Å to about 1000 Å. The bandgap of strained silicon is smaller than non-strained silicon. This enables hot carriers in the subsequently formed memory device, described in more detail below, to be more easily generated and enables lower supply voltages to be used for the memory device.

Figure 2B:
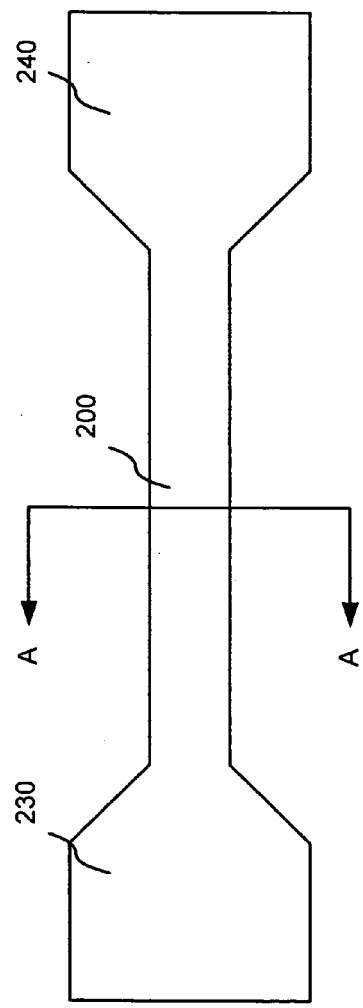
FIG. 2B schematically illustrates the top view of the semiconductor device of FIG. 2A in accordance with an exemplary embodiment of the present invention.

After the formation of fin 200, source and drain regions may be formed adjacent the respective ends of fin 200. For example, in an exemplary embodiment, a layer of silicon, germanium or combination of silicon and germanium may be deposited, patterned and etched in a conventional manner to form source and drain regions. Alternatively, the silicon-germanium layer 130 and/or silicon layer 140 (FIG. 1) may be patterned and etched to form source and drain regions. FIG. 2B illustrates a top view of semiconductor 100 including source region 230 and drain region 240 formed adjacent fin 200 on buried oxide layer 120, according to an exemplary embodiment of the present invention.

Figure 3:
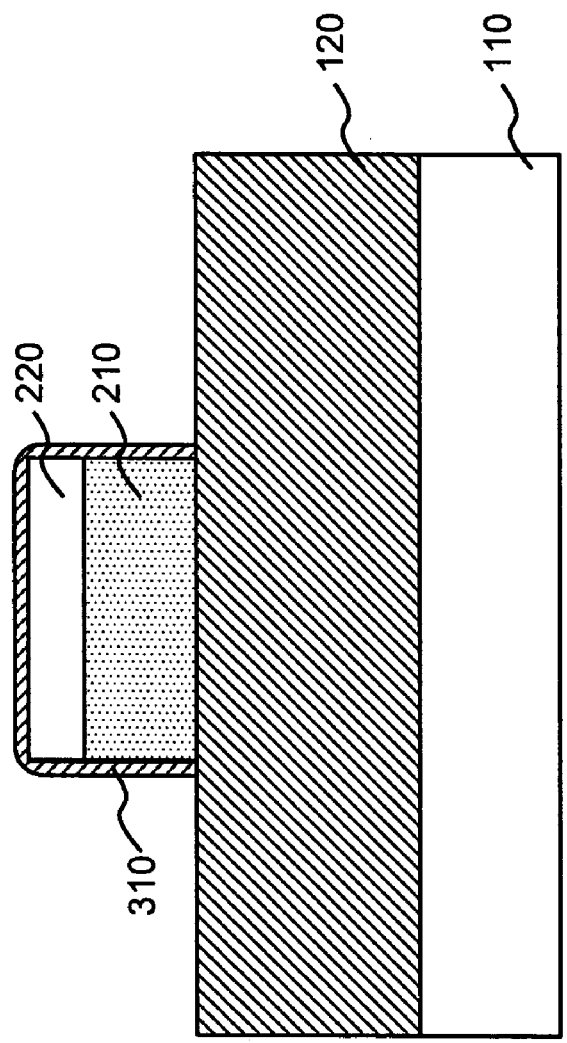
FIG. 3 is a cross-section illustrating the formation of a dielectric layer on the fin of FIG. 2A in accordance with an exemplary embodiment of the present invention.

The photoresist mask 150 may be removed and a dielectric layer may then be formed on fin 200. For example, a thin oxide layer 310 may be thermally grown on fin 200, as illustrated in FIG. 3. The cross-sectional view of FIG. 3 is taken along line AA in FIG. 2B. Oxide layer 310 may be grown to a thickness of about 15 Å to about 30 Å and may be formed on the exposed surfaces of silicon-germanium layer 210 and silicon layer 220. Oxide layer 310 may act as a tunnel oxide layer for semiconductor device 100.

Figure 4:
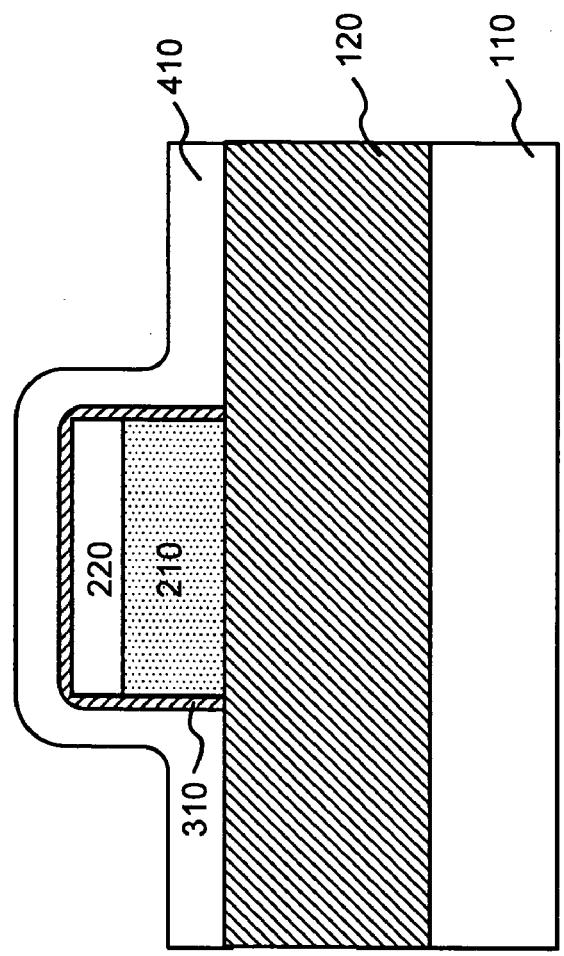
FIG. 4 is a cross-section illustrating the formation of a floating gate in accordance with an exemplary embodiment of the present invention.

A conductive layer 410, such as undoped polycrystalline silicon, may then be deposited over semiconductor device 100, as illustrated in FIG. 4. The thickness of conductive layer 410 may range from about 150 Å to about 400 Å. Alternatively, conductive layer 410 may comprise another conductive material, such as germanium or combinations of silicon and germanium. Conductive layer 410 may act as a floating gate electrode for semiconductor device 100.

Figure 5:
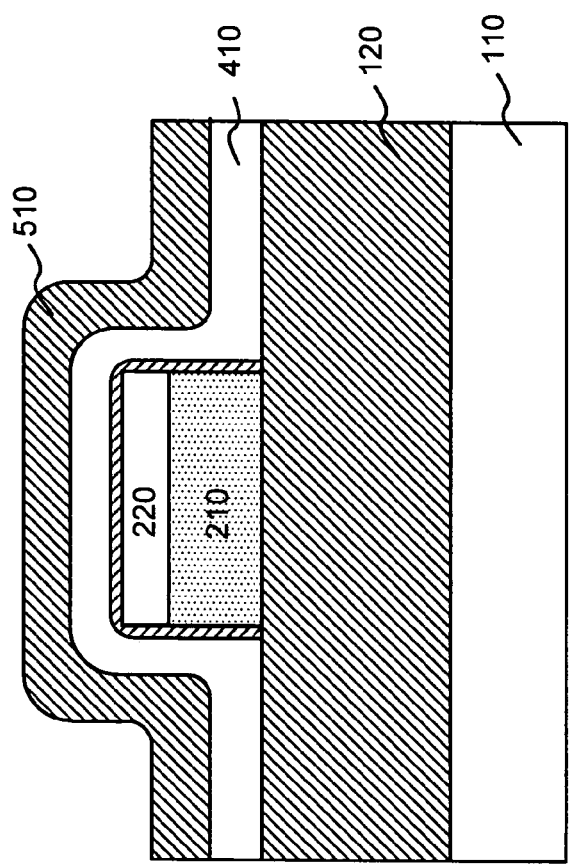
FIG. 5 is a cross-section illustrating the formation of an inter-gate dielectric layer in accordance with an exemplary embodiment of the present invention.

Next, a dielectric layer 510 may be formed on conductive layer 410. For example, a dielectric, such as $SiO_2$, an oxide-nitride-oxide (ONO) stack or some high-K dielectric material, such as $HfO_2$ or $ZrO_2$, may be deposited or thermally grown on layer 410, as illustrated in FIG. 5. Dielectric layer 510 may have a thickness ranging from about 200 Å to about 800 Å and may act as an inter-gate dielectric.

Figure 6:
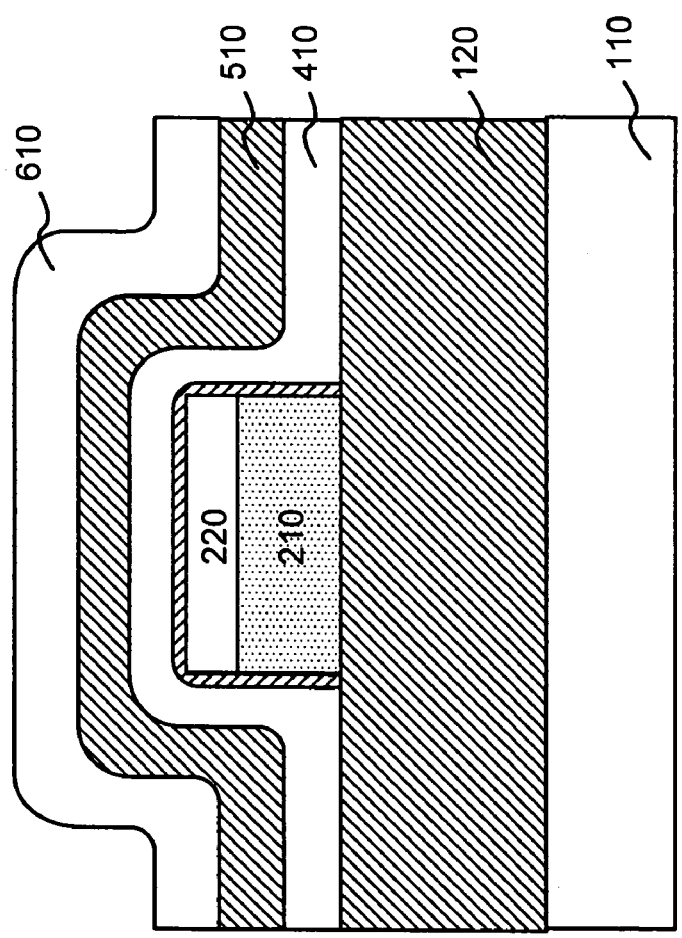
FIG. 6 is a cross-section illustrating the formation of a gate material on the device of FIG. 5 in accordance with an exemplary embodiment of the present invention.

A silicon layer 610 may then be deposited over semiconductor 100, as illustrated in FIG. 6. Silicon layer 610 may be used as the gate material for the subsequently formed control gate electrode(s). In an exemplary implementation, silicon layer 610 may comprise polysilicon deposited using conventional chemical vapor deposition (CVD) to a thickness ranging from about 200 Å to about 1000 Å. Alternatively, other semiconducting materials, such as germanium or combinations of silicon and germanium, or various metals may be used as the gate material.

Figure 7:
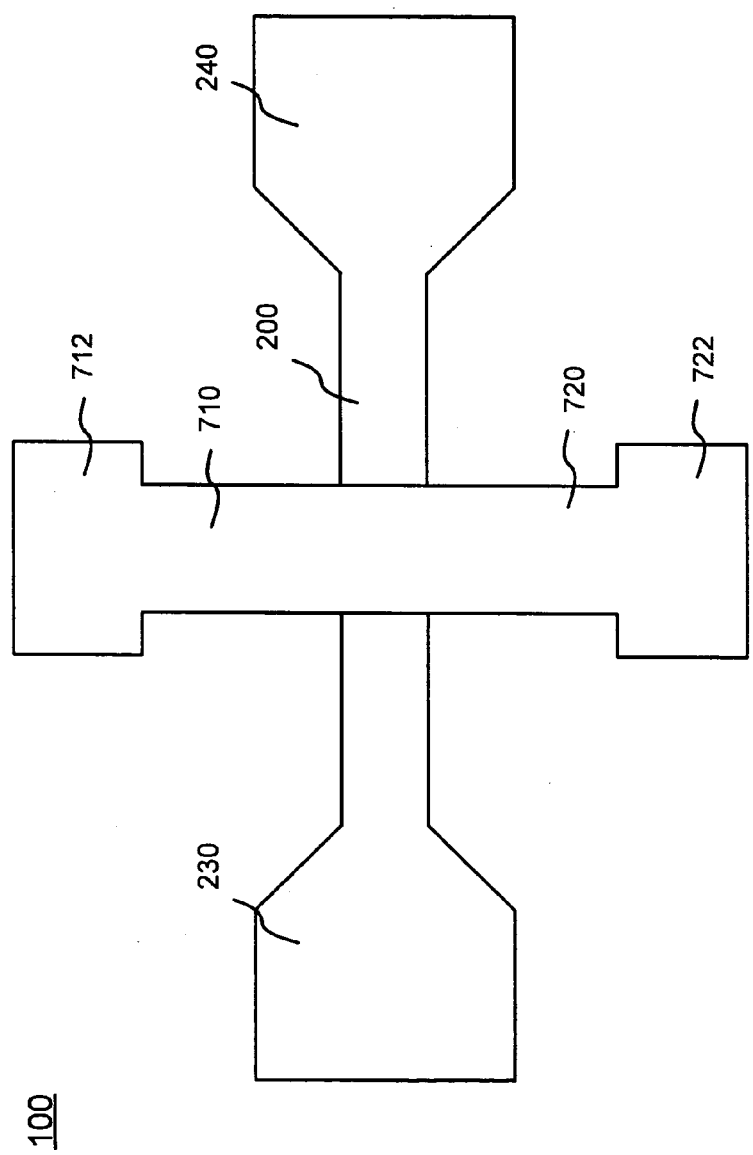
FIG. 7 is a top view illustrating a memory device formed in accordance with an exemplary embodiment of the present invention.

Semiconductor device 100 may then be patterned and etched to form the control gates for semiconductor device 100. For example, FIG. 7 illustrates a top view of semiconductor device 100 consistent with the present invention after the control gate electrodes are formed. As illustrated, semiconductor device 100 may include a double gate structure with gates 710 and 720 disposed on either side of fin 200. The gate dielectric layers 310 and 510 are not shown in FIG. 7 for simplicity. Gates 710 and 720 may include gate electrodes or contacts 712 and 722 formed at the respective ends of gates 710 and 720, as illustrated in FIG. 7.

The source/drain regions 230 and 240 may then be doped. For example, n-type or p-type impurities may be implanted in source/drain regions 230 and 240. For example, an n-type dopant, such as phosphorous, may be implanted at a dosage of about $10 \times 10^{15}$ atoms/cm$^2$ to about $10 \times 10^{16}$ atoms/cm$^2$ and an implantation energy of about 5 KeV to about 50 KeV. Alternatively, a p-type dopant, such as boron, may be implanted at similar dosages and implantation energies. The particular implantation dosages and energies may be selected based on the particular end device requirements. One of ordinary skill in this art would be able to optimize the source/drain implantation process based on the circuit requirements. In addition, sidewall spacers may optionally be formed prior to the source/drain ion implantation to control the location of the source/drain junctions based on the particular circuit requirements. Activation annealing may then be performed to activate the source/drain regions 230 and 240.

The resulting semiconductor device 100 illustrated in FIG. 7 includes a first gate 710 and a second gate 720 and can operate as a non-volatile memory device, such as a flash electrically erasable programmable read only memory (EEPROM). Each of gates 710 and 720 functions as control gates for the flash memory device 100 and layer 410 (FIG. 4) functions as the floating gate electrode. Programming of semiconductor device 100 may be accomplished by applying a bias of, for example, about 5 volts to about 15 volts to control gate 710 or 720. For example, if the bias is applied to control gate 710, electrons may tunnel from the fin 200 into floating gate 410 via oxide layer 310. A similar process may occur if the bias is applied to control gate 720. That is, electrons may tunnel into floating gate 410.

Erasing may be accomplished by applying a bias of, for example, about 5 volts to about 15 volts to control gate 710 or 720. During erasing, electrons may tunnel from the floating gate 410 into the source/drain regions 230 and 240 via oxide layer 310 and fin 200.

Thus, in accordance with the present invention, a flash memory device is formed with a strained fin. The main channel of semiconductor device 100 is formed on the top portion of fin 200 (e.g., layer 220), which is the strained silicon layer. Advantageously, the bandgap of strained silicon is smaller than non-strained silicon. This makes it easier for hot carriers to be generated. In other words, lower supply voltages may be used to make the resulting flash memory device work properly. The present invention can also be easily integrated into conventional semiconductor fabrication processing.

Other Embodiments

Figure 8A:
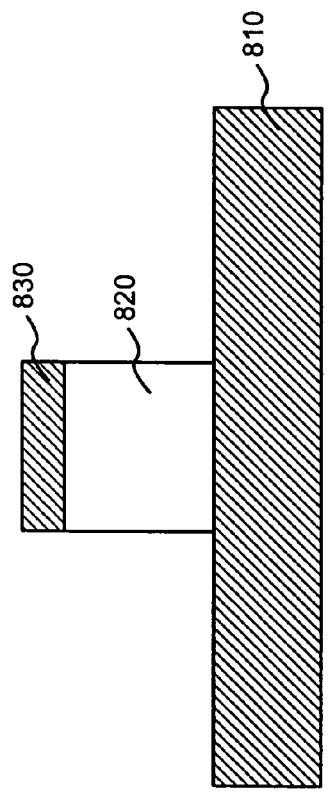

In other embodiments of the invention, a flash memory with a fully silicided floating gate may be formed. FIG. 8A illustrates a semiconductor device 800 including a fin 820 with a dielectric cap 830 formed over a buried oxide layer 810, in accordance with another embodiment consistent with the invention. Buried oxide layer 810 may be formed on a substrate (not shown). The fin 820 may comprise polycrystalline silicon, germanium or silicon-germanium.

Figure 8B:
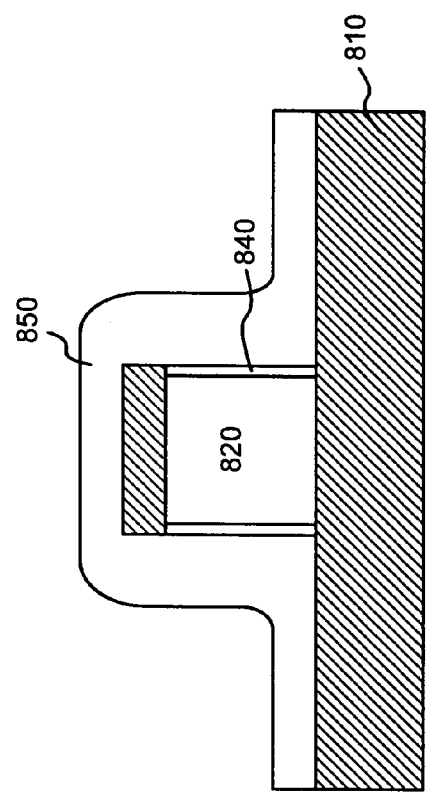

After the fin structure 820 is formed, an oxide may be deposited or thermally grown on the side surfaces of fin 820. For example, an oxide material 840 may be formed on the exposed side surfaces of fin 820, as illustrated in FIG. 8B. Next, a semiconducting material 850, such as polycrystalline silicon, may be formed over the fin structure 820, as illustrated in FIG. 8B. Semiconducting layer 850 may function as a floating gate electrode for semiconductor device 800.

A metal layer, such as titanium, may be deposited over semiconducting layer 850, followed by a thermal annealing to turn the semiconducting material into metal-silicide layer 860, as illustrated in FIG. 8C. Metal-silicide layer 860 may be used to form the floating gate for semiconductor device 800 and may be fully silicided. That is, metal-silicide layer 860 may be silicided throughout to buried oxide layer 810.

An intergate dielectric 870 may be formed over layer 860, followed by the formation of a control gate layer 880. Semiconductor 800 may then be patterned and etched to form control gates. The resulting semiconductor device 800 may include one or more control gates with a fully silicided floating gate.

Figure 9A:
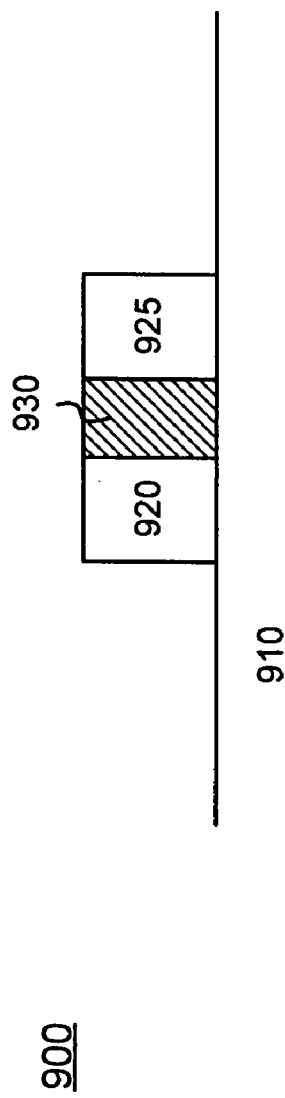
FIGS. 9A-9C are cross-sections illustrating the formation of a dual gate memory device in accordance with another embodiment of the present invention.

In another exemplary embodiment, a dual gate flash memory device may be formed. In this embodiment, a semiconductor device 900 that includes fins 920 and 925, separated by silicon oxide structure 930 may be formed on buried oxide layer 910, as illustrated in FIG. 9A. Buried oxide layer 910 may be formed on a substrate (not shown). Fins 920 and 925 may be formed by forming amorphous silicon spacers adjacent oxide structure 930 followed by a metal-induced crystallization (MIC) process using, for example, nickel. For example, nickel may be deposited on the amorphous silicon spacers followed by a thermal annealing to convert the amorphous silicon into a crystalline silicon.

Figure 9B:
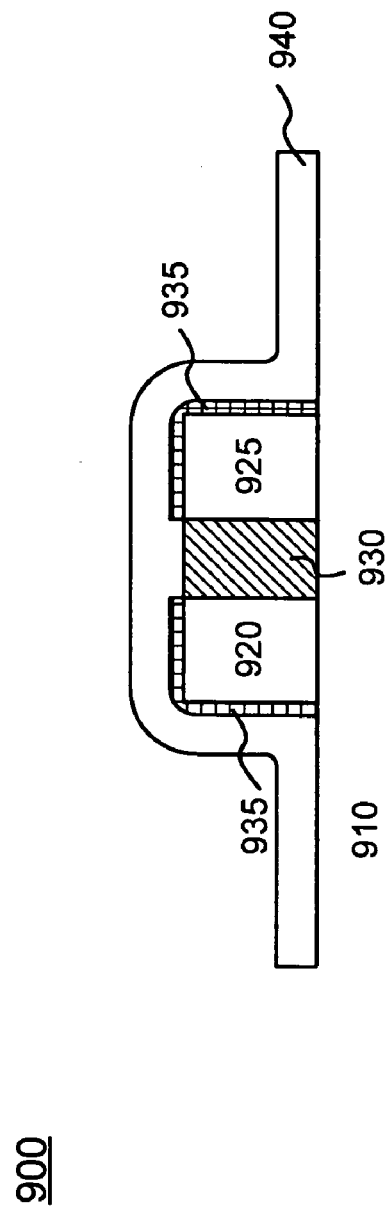

An oxide layer 935 may be formed on the exposed surfaces of fins 920 and 925, as illustrated in FIG. 9B. Next, a floating gate layer 940 may be formed over fins 920 and 925, as also illustrated in FIG. 9B. The floating gate layer 940 may include, for example, polysilicon.

Figure 9C:
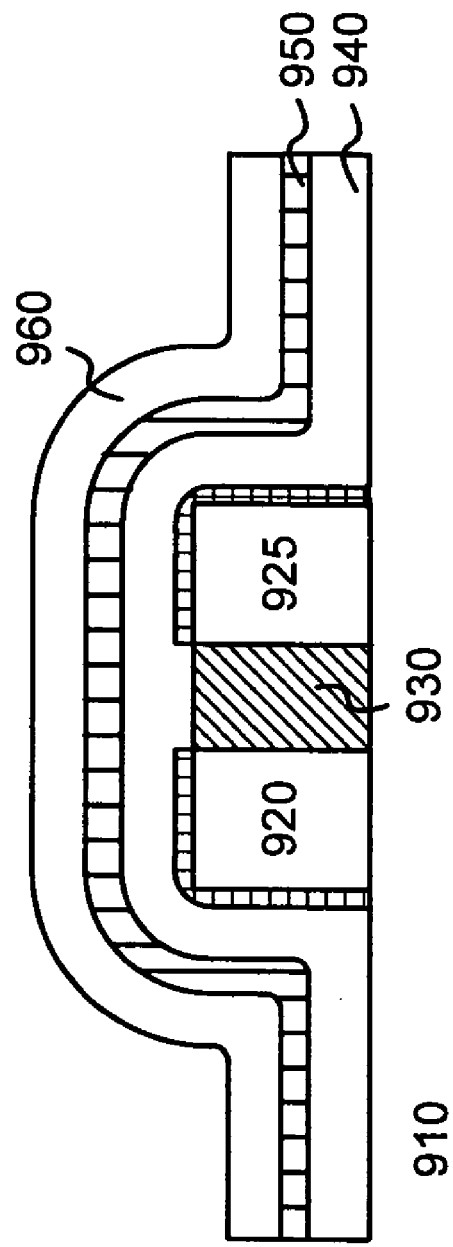

An intergate dielectric layer 950 may be formed over floating gate layer 940, followed by the formation of control gate layer 960, as illustrated in FIG. 9C. Source/drain regions may be formed at the respective ends of fins 920 and 925. Semiconductor device 900 may then be patterned and etched to form two control gates. The resulting semiconductor device 900 includes a dual gate structure with two gates and two fins.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable in the manufacturing of semiconductor devices and particularly in FinFET memory devices with design features of 100 nm and below. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail. In addition, while series of processes for forming the semiconductor devices consistent with the present invention have been described, it should be understood that the order of the process steps may be varied in other implementations consistent with the present invention.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

In addition, no element, act, or instruction used in the description of the present application should be construed as critical or essential to the invention unless explicitly described as such. Also, as used herein, the article "a" is intended to include one or more items. Where only one item is intended, the term "one" or similar language is used.

What is claimed is:

1. A memory device, comprising:
   a substrate;
   an insulating layer formed on the substrate;
   a fin structure formed on the insulating layer, the fin structure comprising a first portion comprising silicon-germanium and a second portion comprising a strained silicon layer disposed on the first portion;
   a semiconducting layer formed over the fin structure, the semiconducting layer acting as a floating gate for the memory device;

a dielectric layer formed on the semiconducting layer, the dielectric layer acting as an inter-gate dielectric for the memory device; and a control gate formed on the gate dielectric layer.

2. The memory device of claim 1, wherein the first portion of the fin structure has a thickness ranging from about 300 Å to about 500 Å and the second portion of the fin structure has a thickness ranging from about 150 Å to about 250 Å.

3. The memory device of claim 1, further comprising:

a source region and a drain region formed on the insulating layer and disposed adjacent first and second ends, respectively, of the fin structure.

4. The memory device of claim 3, further comprising:

an oxide layer formed on the fin structure, the oxide layer acting as a tunnel oxide layer for the memory device.

5. The memory device of claim 1, wherein the fin structure has a width ranging from about 100 Å to about 1000 Å.

6. The memory device of claim 1, wherein the semiconducting layer comprises polycrystalline silicon having a thickness ranging from about 150 Å to about 400 Å.

7. The memory device of claim 1, wherein the dielectric layer has a thickness ranging from about 200 Å to about 800 Å.

8. The memory device of claim 1, wherein the control gate comprises polycrystalline silicon having a thickness ranging from about 200 Å to about 1000 Å.

9. A memory device, comprising:

a substrate;

an insulating layer formed on the substrate;

a fin structure formed on the insulating layer, the fin structure comprising a first portion and a second portion formed on the first portion, the first portion comprising a non-strained material and the second portion comprising a strained material;

a floating gate formed above the fin structure;

a dielectric layer formed on the floating gate, the dielectric layer acting as an inter-gate dielectric for the memory device; and a control gate formed on the dielectric layer.

10. The memory device of claim 9, wherein the first portion of the fin structure has a thickness greater than the thickness of the second portion of the fin structure.

11. The memory device of claim 9, further comprising:

a source region and a drain region formed on the insulating layer and disposed adjacent first and second ends, respectively, of the fin structure; and an oxide layer formed on the fin structure, the oxide layer acting as a tunnel oxide layer for the memory device.

12. The memory device of claim 9, wherein the fin structure has a width ranging from about 100 Å to about 1000 Å.

13. The memory device of claim 9, wherein the floating gate comprises polycrystalline silicon having a thickness ranging from about 150 Å to about 400 Å and the dielectric layer has a thickness ranging from about 200 Å to about 800 Å.

14. The memory device of claim 9, wherein the control gate comprises polycrystalline silicon having a thickness ranging from about 200 Å to about 1000 Å.

15. The memory device of claim 9, wherein the insulating layer comprises a buried oxide layer and the substrate comprises silicon-germanium.

16. The memory device of claim 9, wherein the non-strained material comprises silicon-germanium.

17. The memory device of claim 9, wherein the strained material comprises silicon.

18. The memory device of claim 9, wherein the non-strained material comprises silicon-germanium and the strained material comprises silicon.

* * * * *

UNITED STATES PATENT AND TRADEMARK OFFICE
CERTIFICATE OF CORRECTION

PATENT NO. : 7,279,735 B1 Page 1 of 1
APPLICATION NO. : 10/838215
DATED : October 9, 2007
INVENTOR(S) : Bin Yu et al.

It is certified that error appears in the above-identified patent and that said Letters Patent is hereby corrected as shown below:

At column 3, line 43, "22b" should be "220"

Signed and Sealed this

Sixteenth Day of December, 2008

JON W. DUDAS
*Director of the United States Patent and Trademark Office*